United States Patent [19]
Carlson

[11] Patent Number: 4,556,841
[45] Date of Patent: Dec. 3, 1985

[54] MEASUREMENT SYSTEM FOR CHARACTERIZING POWER AMPLIFIER AND OTHER DEVICE PERFORMANCE

[75] Inventor: Eric R. Carlson, Fair Haven, N.J.

[73] Assignee: AT&T Bell Laboratories, Murray Hill, N.J.

[21] Appl. No.: 554,949

[22] Filed: Nov. 25, 1983

[51] Int. Cl.$^4$ .................... G01R 27/00; G01R 27/04
[52] U.S. Cl. ................ 324/73 R; 324/57 R; 324/58 R; 330/2
[58] Field of Search ............... 324/73 R, 57 R, 58 R, 324/158 T, 73 AT, 77 B; 364/482, 551, 553, 579, 580; 330/2

[56] References Cited

U.S. PATENT DOCUMENTS

| 3,808,526 | 4/1974 | Jackson | 324/57 R |
| 3,825,828 | 7/1974 | Pfeiffer | 324/158 T |
| 4,135,153 | 1/1979 | Stone | 324/158 T |

FOREIGN PATENT DOCUMENTS

| 998980 | 2/1983 | U.S.S.R. | 330/2 |

OTHER PUBLICATIONS

Souders, T. M.; "A Bridge Circuit ..."; IEEE Trans. on Instrumentation and Measurement; vol. IM-27; No. 4; Dec. 1978; pp. 409-413.

Klatskin et al.; "Fabrication of ..."; RCA Review; vol. 42; No. 4; Dec. 1981; pp. 576-595.

Primary Examiner—Ernest F. Karlsen
Attorney, Agent, or Firm—Erwin W. Pfeifle

[57] ABSTRACT

The present invention relates to a measurement system for characterizing device performance comprising a set of generating and measuring instruments which are connected to a controller via a data bus. The instruments provide the necessary bias and RF signals to the device and concurrently measure its performance. Primarily three functions are provided: (a) establishment of a desired input signal by the user or the controller and the monitoring in real time of the device performance, (b) taking of a set of measurements and interpreting the measurements to characterize the device performance, and (c) displaying the measured and interpreted data for immediate study and the recording thereof for subsequent use. The automated capability permits a user to tune a device and simultaneously optimize its parameters.

9 Claims, 12 Drawing Figures

MEASUREMENT SYSTEM FOR CHARACTERIZING POWER AMPLIFIER AND OTHER DEVICE PERFORMANCE

BACKGROUND OF THE INVENTION

1. Field of the Invention

The present invention relates to a measurement system for characterizing power amplifier performance and, more particularly, for providing an automated testing and measurement system for tuning in real time a radio frequency amplifier after the device and matching circuits have been assembled.

2. Description of the Prior Art

It is always desirous to obtain measurements which can improve the development of solid-state power amplifiers because of the large volume of measurements involved in such a development. The measurements are needed to characterize the devices used in an amplifier, so that matching circuits can be designed, and to tune the amplifier after the device and matching circuits have been assembled. Empirical tuning is required because of variations in device parameters, variations in matching network performance due to fabrication tolerances, and limitations in the data obtained in the initial device characterization.

An example of a prior art testing and measurement system is disclosed in the article "Fabrication of Lumped-Element Broadband GaAs MESFET Microwave Power Amplifiers" by J. B. Klatskin et al in RCA Review, Vol. 42, No. 4, December 1981, at pages 576–595. There, at page 591, it is described that computer analysis permits complete optimization of an amplifier at the point of manufacture. More particularly, the completed amplifier S-parameters are measured and the measured capacitance and inductance are compared to the design values using either the standard FET data or the original S-parameter data of the device. From this information, a decision is made to either (a) replace the device, (b) print a parallel wire if the required inductance is in an adjustable range, or (c) connect tuning pads when the capacitance has too low a value. The amplifier is remeasured after any changes until it is no longer feasible to implement changes.

A circuit for testing the high frequency current amplifying capability of bipolar transistors is disclosed in U.S. Pat. No. 4,135,153 issued to D. C. Stone on Jan. 16, 1979. There, a transistor test circuit provides for the selection of preferably three widely differing test frequencies for testing transistors normally having respectively relatively small, intermediate and large frequency gain-bandwidth product characteristics. The test circuit is designed to form a linear amplifier circuit with a transistor under test and is provided with an automatic base drive control circuit which provides a substantially fixed predetermined DC collector current. The circuit further includes an indicating means for displaying the product of the selected tests frequency and the current gain of the transistor under test.

The problem remaining in the prior art is to provide a test and measurement system for radio frequency power amplifiers which provides fast, accurate amplifier performance data can improve empirical optimization, allow experimentation over a wide range of tuning parameters, and provide more information on the relationships between parameters.

SUMMARY OF THE INVENTION

The foregoing problem has been solved in accordance with the present invention which relates to a measurement system for characterizing power amplifier performance and, more particularly, for providing an automated testing and measurement system for tuning in real time a radio frequency amplifier after the device and matching circuits have been assembled.

It is an aspect of the present invention to provide a measurement system for characterizing power amplifier performance such as, for example, the transfer characteristics, frequency response, linearity, and dc characteristics of an amplifier operating with both single- and multiple-carrier signals.

It is a further aspect of the present invention to provide a measurement system comprising means for supplying predetermined test signals to the input of the amplifier under test; means for biasing the amplifier; means for modulating the test signals to a predetermined power level and measuring such level at the input and output of the amplifier; means for analyzing the spectrum of the output signal of the amplifier for measuring, for example, the carrier-to-intermodulation noise ratio in response to the test signals applied; and control and display means for controlling the modulating means, interpreting the data produced and displaying these results for real time tuning of the amplifier.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views.

DETAILED DESCRIPTION

The present invention is described hereinafter for use in testing and measuring GaAs FET amplifiers for use at, for example, the 4 GHz radio frequency band. It is to be understood that such description is for exemplary purposes and not for purposes of limitation since with certain obvious modifications such as, for example, the test frequencies used, amplifiers covering a wide range of microwave frequencies, and also devices other than amplifiers, could be measured on the present measurement system.

Figure 1:
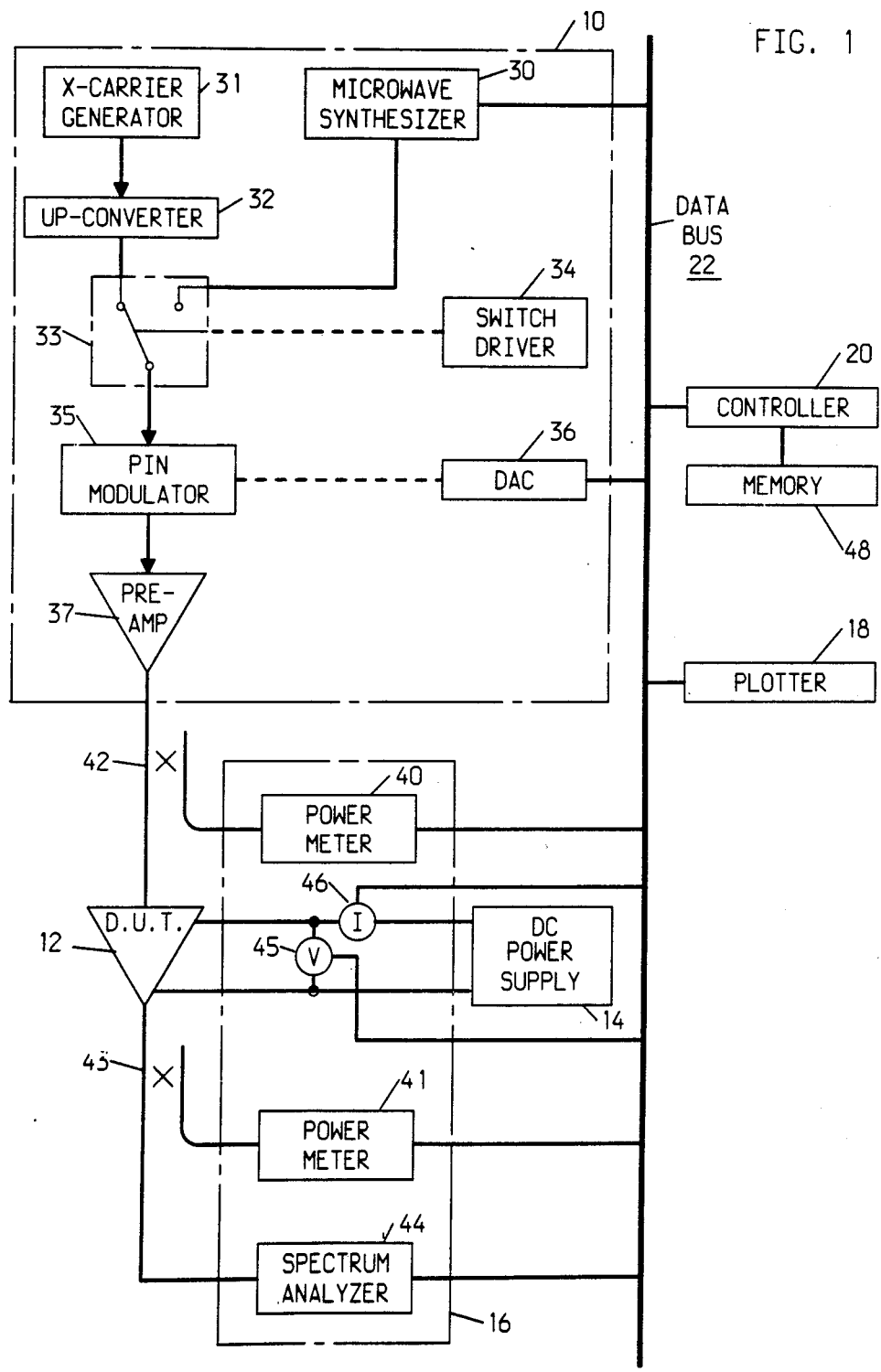
FIG. 1 is a block diagram of a preferred arrangement of the measurement system for characterizing power amplifiers or other devices in accordance with the present invention.

A block diagram of a typical measurement system in accordance with the present invention is shown in FIG. 1. The measurement system comprises radio frequency equipment 10 to provide test signals to the device 12 under test; dc power supply 14 to provide the bias for the device 12 under test; measurement equipment 16 for measuring the bias and other test data; a data display device 18 such as a plotter for providing the data output in a predetermined manner for a user; and a controller 20 for controlling the various equipments and the predetermined progression of the testing and measurements on the device 12 under test. The controller 20 is interconnected with the radio frequency equipment 10, the measurement equipment 16 and the data display device 18 by a data bus 22.

More particularly, in radio frequency equipment 10, a single-carrier test signal is produced by a microwave synthesizer 30. The frequency from synthesizer 30 can be selectively adjusted, under control of controller 20, over a frequency band of interest of the device 12 under test as, for example, 3.7–4.2 GHz. Frequency limits over which the synthesizer 30 can be selectively adjusted for a test sequence should be selectively set, somewhat arbitrarily, by an operator via controller 20 over bus 22 to avoid damage to equipment from accidental out-of-band operation. It is to be understood that synthesizer 30 should have the capability to cover a much wider band of frequencies than that of any one device 12 to be tested to permit the measurement system to be used with various devices covering different frequency bands. For example, synthesizer 30 may itself have a frequency range of 2–18 GHz. It is to be understood that synthesizer 30 can comprise any suitable device such as, for example, a Hewlett Packard model 8672A microwave synthesizer.

Figure 2:
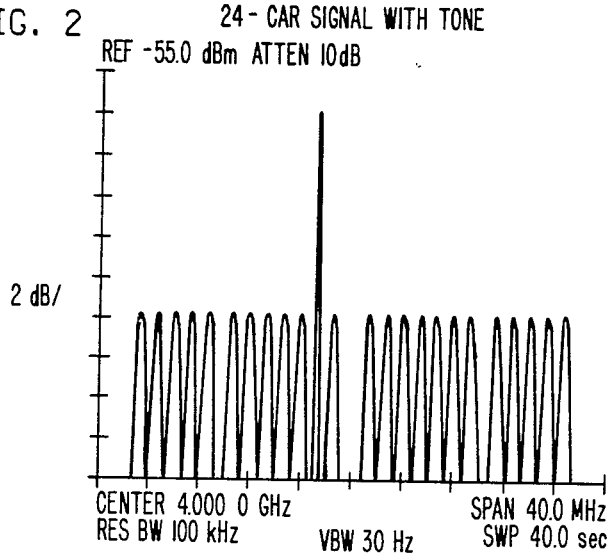
FIG. 2 is an exemplary 24-carrier test signal manifold from the X-carrier generator of FIG. 1 where one modulated carrier has been replaced by an unmodulated carrier with the same power.

Within radio frequency equipment 10, an X-carrier signal generator 31 is also provided, where X is equal to, for example, 24 and the test signal produced by generator 31 can have a predetermined bandwidth of, for example, 34.5 MHz and consist of 24 Quadrature Phase Shift Keying (QPSK) signals each modulated by a predetermined Mb/s pseudorandom sequence; e.g., 1.76 Mb/s. It is to be understood that for the tests, one modulated signal can be replaced by an unmodulated carrier having the same power. An examplary resulting signal, produced by generator 31 at 70 MHz, is shown in FIG. 2. The resultant signal from generator 31 is then upconverted to the proper ratio frequency, e.g., 4 GHz, by an upconverter 32.

Depending on the test to be performed, the output signal from microwave synthesizer 30, or the upconverted output signal from upconverter 32 is selected by a coaxial switch 33 which is under the control of controller 20 via data bus 22 and a switch driver 34. Coarse control of the single-carrier power level is done in synthesizer 30, which can have, for example, a 1 db output power resolution. Fine control of the output power level is achieved with a PIN modulator 35 driven by a digital-to-analog converter (DAC) 36 under the control of controller 20. More particularly, in the single-carrier power routines, differences between the actual and the desired power levels of greater than the heretofore mentioned exemplary 1 db are corrected by changing the synthesizer 30 output level, and smaller differences by adjusting the PIN modulator 35 attenuation. It is desirable that controller 20 adjusts the synthesizer 30 level to keep the modulator 35 attenuation within a predetermined range of, for example, 1.5 db, in order to avoid changes in the slope of the modulator 35 attenuation vs. voltage characteristic. In principle, such precise power control is not necessary because controller 20 is generally adapted to perform data interpolations, but it makes manual data comparisons more convenient. The controller 20 also checks that the synthesizer 30 output level does not exceed, for example, 0 dBm.

The power level of the X-carrier signal generated in generator 31 is also set by PIN modulator 35 to a predetermined tolerance of, for example, 0.05 db. Controller 20 obtains a reading of the actual power from a power meter 40 via bus 22 and then adjusts the modulator 35 attenuation to obtain the desired power level. It is to be understood that PIN modulator 35 can comprise any suitable device known in the art as, for example, the Hewlett Packard Model HP8733A PIN modulator.

The selected output signal from radio frequency equipment 10 can be obtained directly from the output of PIN modulator 35 or from an optional preamplifier 37, connected to the output of PIN modulator 35, to obtain an adequate power level for testing high-power, low-gain stages. For example, about 37 dBm input power is needed to adequately test a hybrid-combined stage producing 40 dBm. Preamplifier 37 must be linear to avoid contributions to intermodulation measurements and can be removed or bypassed when testing amplifiers which do not require high-level input signals.

Input and output power levels to and from the device 12 under test is measured using calibrated directional couplers 42 and 43, respectively, and respective microwave power meters 40 and 41 which can comprise any suitable meter as, for example, the Hewlett Packard Model HP436A meter operated in the triggered mode and using internal delay. The system can allow an additional delay for the thermal settling time of power sensors included in the meters. It is to be further understood that the power meters 40 and 41 are usually zeroed before RF power is turned on.

The directional couplers 42 and 43 are calibrated preferably on an automated network analyzer such as, for example, the Hewlett Packard Model HP8409B analyzer. Preferably the coupling coefficients are sufficiently constant with frequency that a single value can be used over the radio frequency range to be used for the device 12 under test. It is to be understood that it would also not be difficult to use an array of values to compensate for coupler frequency response.

A spectrum analyzer 44 is provided with measurement equipment 16 to permit, if desired, Carrier-to-Intermodulation noise (C/IM) ratio measurements to be made on the device 12 under test when using the X-carrier test signals. The X-carrier measurement of linearity is fast and permits results which are directly related to the capacity of a real service. It is to be understood that linearity information may be obtained from phase transfer measurements, but these measurements are not possible in real time. Alternatively, two-tone tests could be used and are fast, but their results are difficult to relate to broad-band measurements. Therefore, it is preferable to use a X-carrier measurement, where X is, for example, equal to 24 as hereinbefore mentioned. The controller 20 interrogates spectrum analyzer 44 via data bus 22 to make direct measurements of the power of the unmodulated carrier in the exemplary 24-carrier test signal and the intermodulation noise around that carrier. The power level at the peak of the unmodulated carrier is read with the analyzer 44 set to a predetermined frequency span of, for example, 500 kHz; a predetermined resolution bandwidth of, for example, 30 kHz; and a predetermined video bandwidth of, for example, 100 Hz. It is to be understood that these parameters were chosen to provide a rapid sweep with signal fluctuations of less than a predetermined amount, and that such parameters, or other parameters, could be used depending on the device to be tested and the results desired. It is to be further understood that analyzer 40 can comprise any suitable device as, for example, a Hewlett Packard Model HP8566A analyzer.

In operation, for the intermodulation noise measurement, analyzer 40 is switched into the non-sweeping mode at a predetermined frequency of, for example, 250 kHz above the modulated carrier, and the video bandwidth is reduced to, for example, 3 Hz to improve the averaging of the intermodulation noise signal. The noise level is then read at a multiple of points along the sweep and averaged for further noise reduction. The analyzer 44 frequency is then shifted to the exemplary predetermined frequency of 250 kHz below the carrier, and the noise measurements repeated. The controller 20 then obtains the C/IM ratio by dividing the carrier power by the average noise power. It is to be understood that corrections can be implemented for the log amplifier response to noise, the detector response, and the noise bandwidth of the "resolution bandwidth" filter in the analyzer. With the same reference level for both the carrier and noise measurements and only a small frequency difference, the systematic errors in the measurement should be dominated by the linearity of the spectrum analyzer 44 log amplifier gain transfer characteristics.

Controller 20 also selectively obtains device 12 bias voltage and current measurements from a digital voltmeter 45 via bus 22. Voltmeter 45 can comprise any suitable device as, for example, a Hewlett Packard Model HP3456A voltmeter. The bias current is read by controller 20 either in terms of the "recorder output" voltage of a clip-on millimeter 46 or as the voltage drop across a series resistor (not shown). Under the control of controller 20, the system can selectively switch between, for example, four dc parameters using, for example, a Hewlett Packard Model HP59306A relay actuator (not shown), which contains a set of six programmable single-pole, double-throw, relays.

Initially, the desired dc parameter is selected by the user with computer programmable keys forming part of the controller 20. Controller 20 would then set the switches in said relay actuator so that the parameter is measured by the digital voltmeter 45. Controller 20 can also load a scale factor into a register of the voltmeter 45, and the voltmeter then scales all readings to the appropriate units, e.g., drain current in mA. When taking measurements, controller 20 would normally read the parameters to be measured in sequence.

In general, immediately after the completion of a measurement test, the test data is provided to the user, for example, on a video display which can be any suitable device as, for example, the screen of the HP8655A spectrum analyzer 44. Such function permits an immediate analysis of the data during the device tuning experiments. Data from prior tests could also be stored in memory of controller 20 for reference purposes with the difference between the presently read data and the reference data computed and displayed. In general, during the series of measurements, individual displays can be made of the single-carrier transfer characteristics using the test signal from synthesizer 30, the X-carrier transfer characteristic, the carrier-to-intermodulation noise ratio data and the frequency response. This data can also be permanently recorded using any suitable device as, for example, a tape or disc file or a plotter 18 under the control of controller 20 similar to a Hewlett Packard Model HP7470A plotter.

It is to be understood that controller 20 can comprise any suitable controller as, for example, a Hewlett Packard Model HP-85 desk top computer which can provide the functions described herein and comprises a memory 48 which includes a program for carrying out these functions. More particularly, an exemplary program for use with controller 20 can be divided into 4 major states; (1) the INITIAL STATE which waits for parameters to be stored in memory for the device 12 under test, (2) the TUNE STATE where the selected RF signal is applied to the device 12 under test and its response displayed, (3) the MEASURE STATE where a selected set of tests are run on the device 12 under test, and (4) the PLOT STATE where the measured data is plotted for analysis and presentation.

Primarily, the program is initially loaded into memory 48 and the system clock and calender indications are set for inclusion on any subsequently produced plots. In the INITIAL STATE, the user inserts the initial values of any parameters for the device 12 to be tested into storage in memory 48 for use as constants in the program. For example, the single-carrier frequency, the power level to be applied to the device 12 under test, and the range over which the input power will be varied if transfer characteristics are to be measured may be exemplary parameters to be inserted. It is to be understood that these parameters can be changed under user control and displayed to the user. In the INITIAL and TUNE STATES, it may also be desirable to measure and display to the user on the digital voltmeter 45 one of the device's dc parameters.

In the TUNE STATE, entry therein can turn on the RF power. To start the routine for turning on the selected input signal, the power meters 40 and 41 should be zeroed. The desired signal type (single-carrier or X-carrier) is selected and is turned on at a low power level as explained heretofore to protect the device under test and the selected signal is then brought up to the desired level. The user then can have the option of, for example, (a) selecting optional features for the TUNE STATE, (b) having the system toggle between the relative and the dBm scales on the output power meter 41 to permit the reading of both changes in power while tuning the device 12 and the actual output power in dBm, (c) rezeroing the active power meters, (d) aborting the test by turning off the RF power, or (e) selecting the device 12 dc parameters to be monitored during the tuning procedure. If the optional features were selected in part (a) above, controller 20 can be used, under user control, to, for example, change the input power in increments of an exemplary +1 to −1 dB with a display occurring if the input power is changed to a value outside the originally specified parameter range. Other exemplary optional features which may be implemented might be a carrier-to-intermodulation noise ratio measurement routine by, for example, switching on the X-carrier signal, setting the output power to a predetermined value and continuously monitoring the level until the test is completed, or transfer the controller to the MEASURE STATE etc.

In the MEASURE STATE, typical detailed characterization of the device 12 performance can be performed. More particularly, in a typical exemplary sequence, the user can prepare titles to be used on subsequent data printouts, plots and file records. Reference data which can be used for comparison with the presently measured data in video displays can be selected. After the reference data has been entered, the test(s) to be performed can be selected by the user. Typical tests which may be performed can be, for example, (a) single-carrier transfer characteristic measurements, (b) X-carrier transfer characteristic measurements, (c) C/IM noise ratio measurements which automatically turn on the X-carrier signal, or (d) a frequency response measurement or, (e) measuring the device's dc parameters while other tests are in progress. After the test selection, data acquisition begins for that test in the desired sequence under program control, which data is stored in memory 48 and displayed by itself or in comparison with prior reference data. The system can also be made to test conditions and display questions to the user in relation to data just taken as, for example, when an amplifier is being tested, "Continue Past Saturation?" or "Go On With Measurements?" and to wait for user response. If the user elects not to continue, the measurement sequence is terminated. After the measurement sequence is completed, the system can store the data on tape or disc and proceed to the PLOT STATE.

Figure 3:
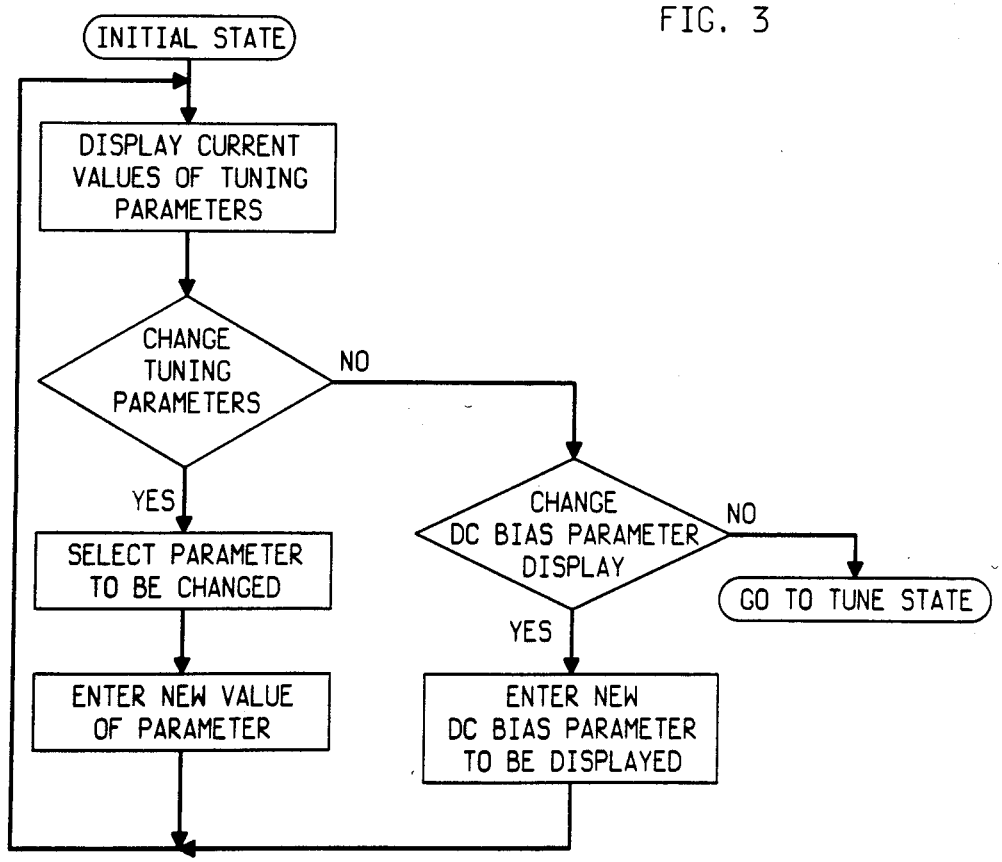
FIG. 3 is a typical flow diagram for implementing the Initial state by the controller of FIG. 1 in accordance with the present invention.
Figure 4:
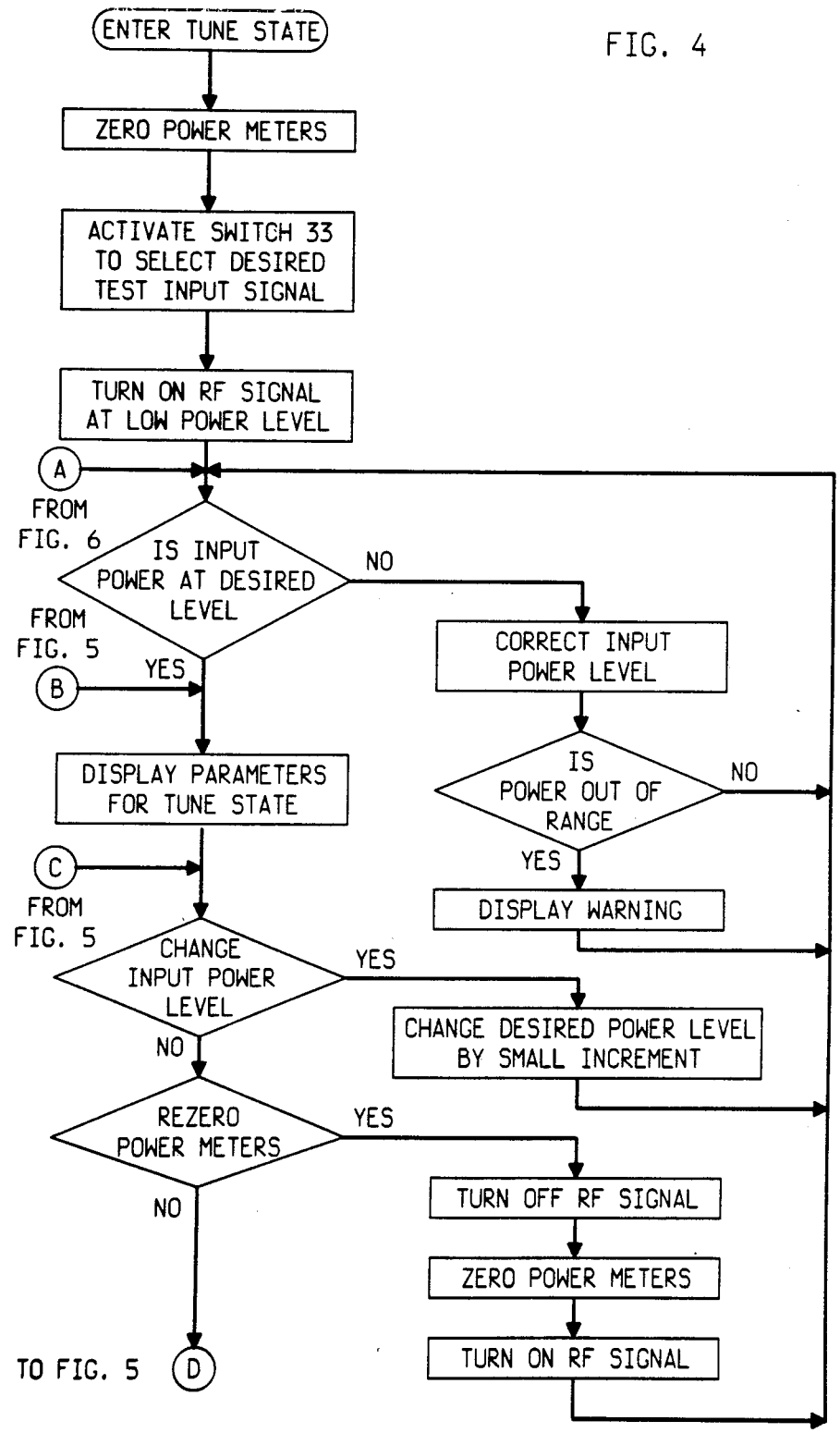
FIGS. 4–6 are typical flow diagrams for implementing the Tune state by the controller of FIG. 1 in accordance with the present invention.
Figure 5:
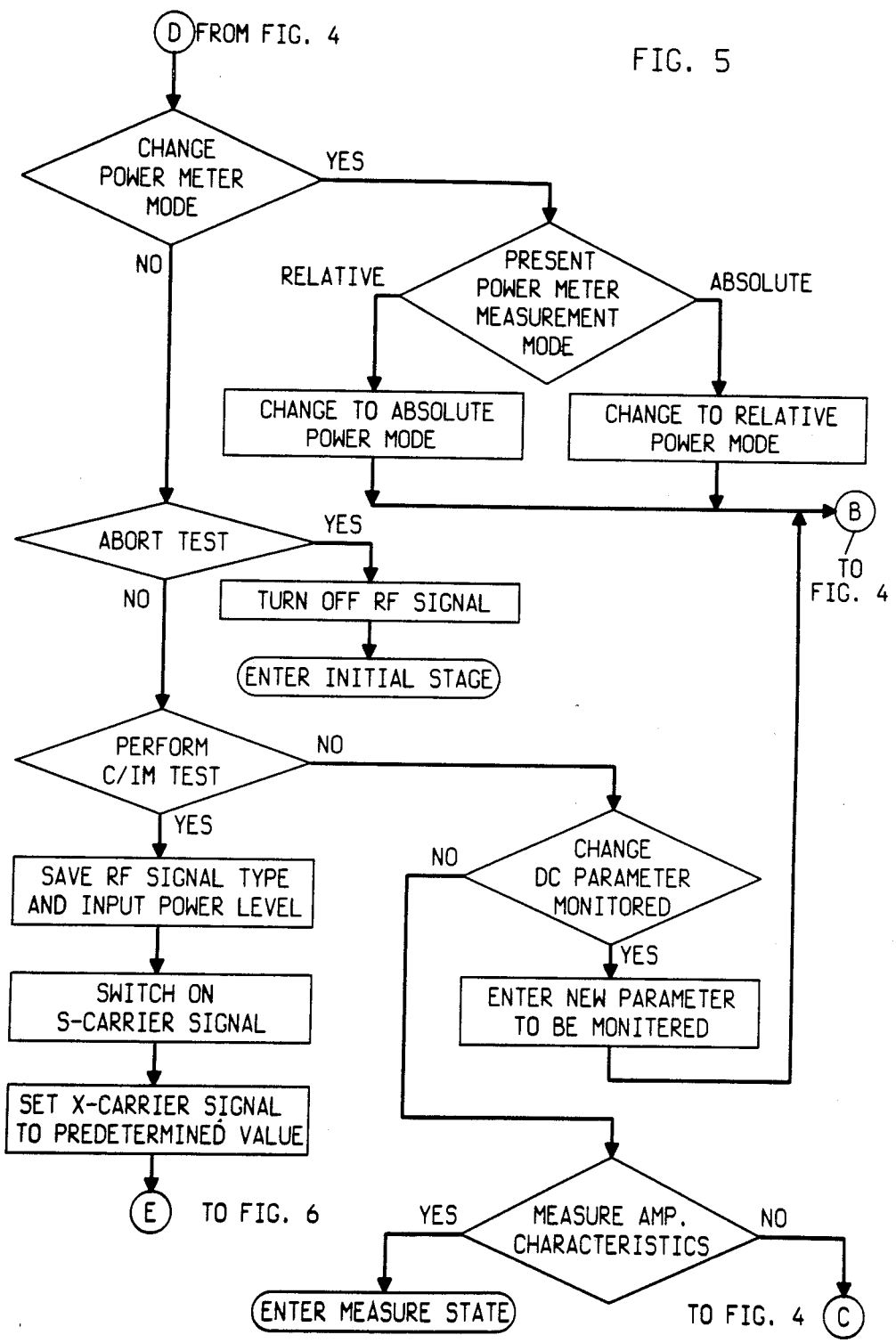
Figure 6:
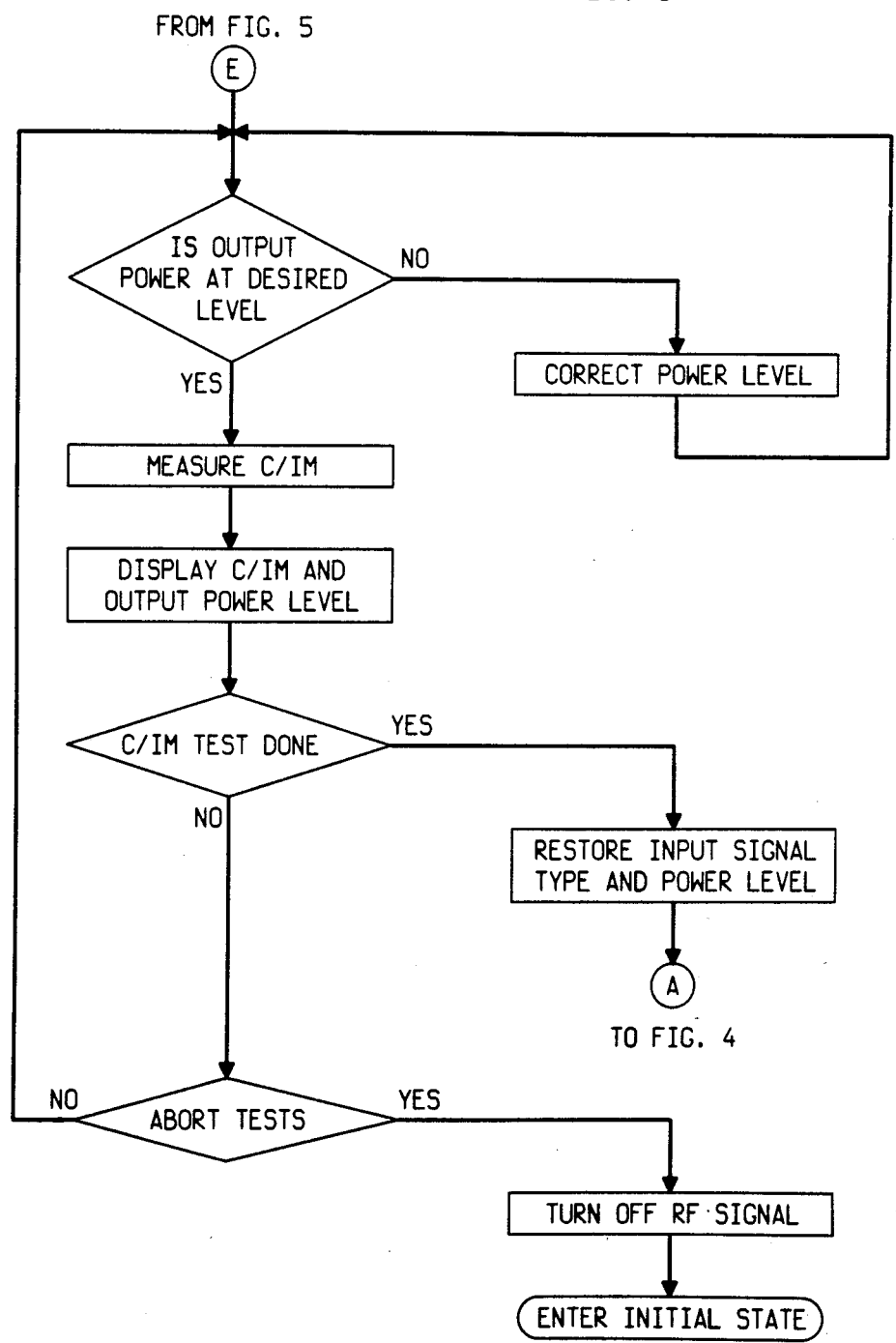
Figure 7:
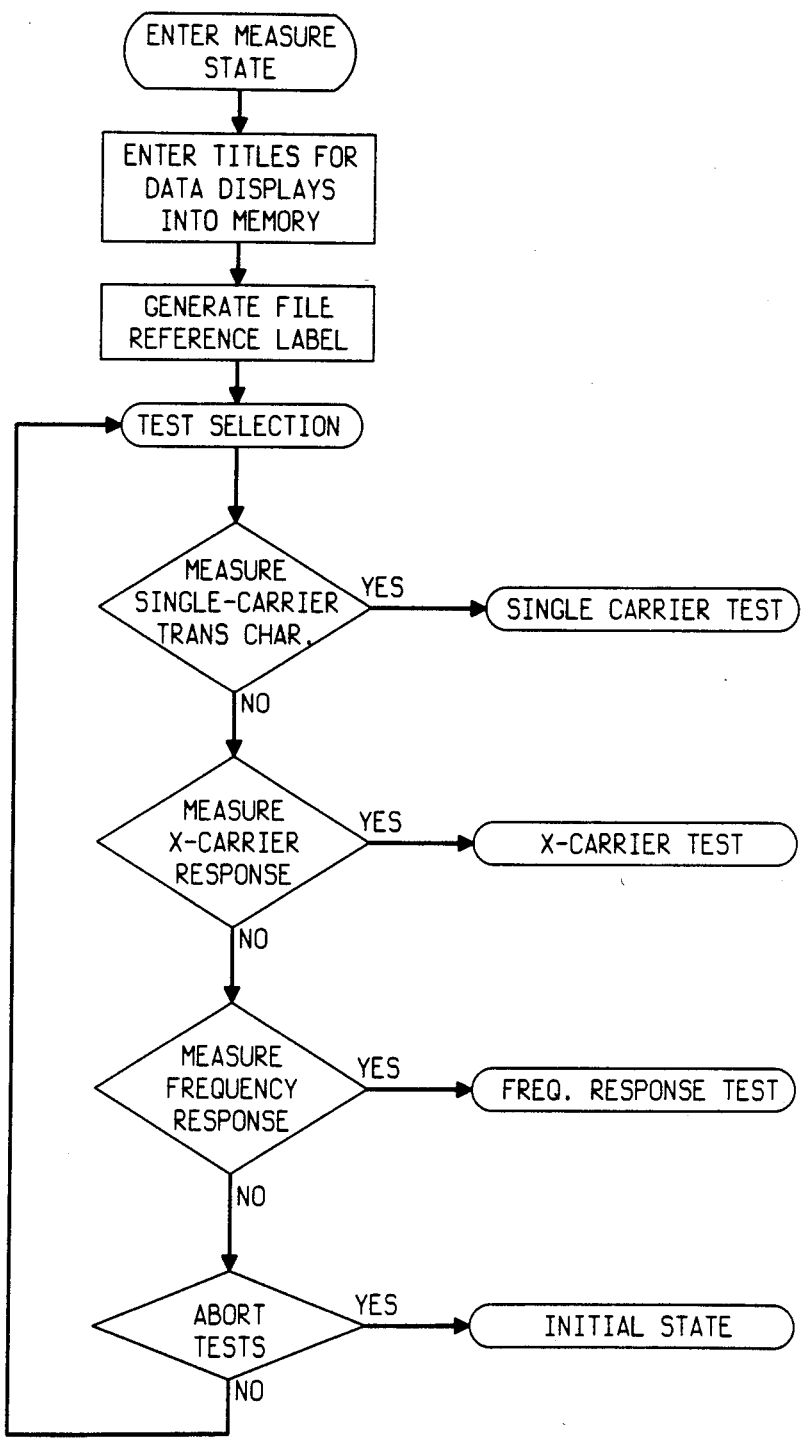
FIG. 7 is a typical flow diagram for implementing the Measure state by the controller of FIG. 1 in accordance with the present invention.
Figure 8:
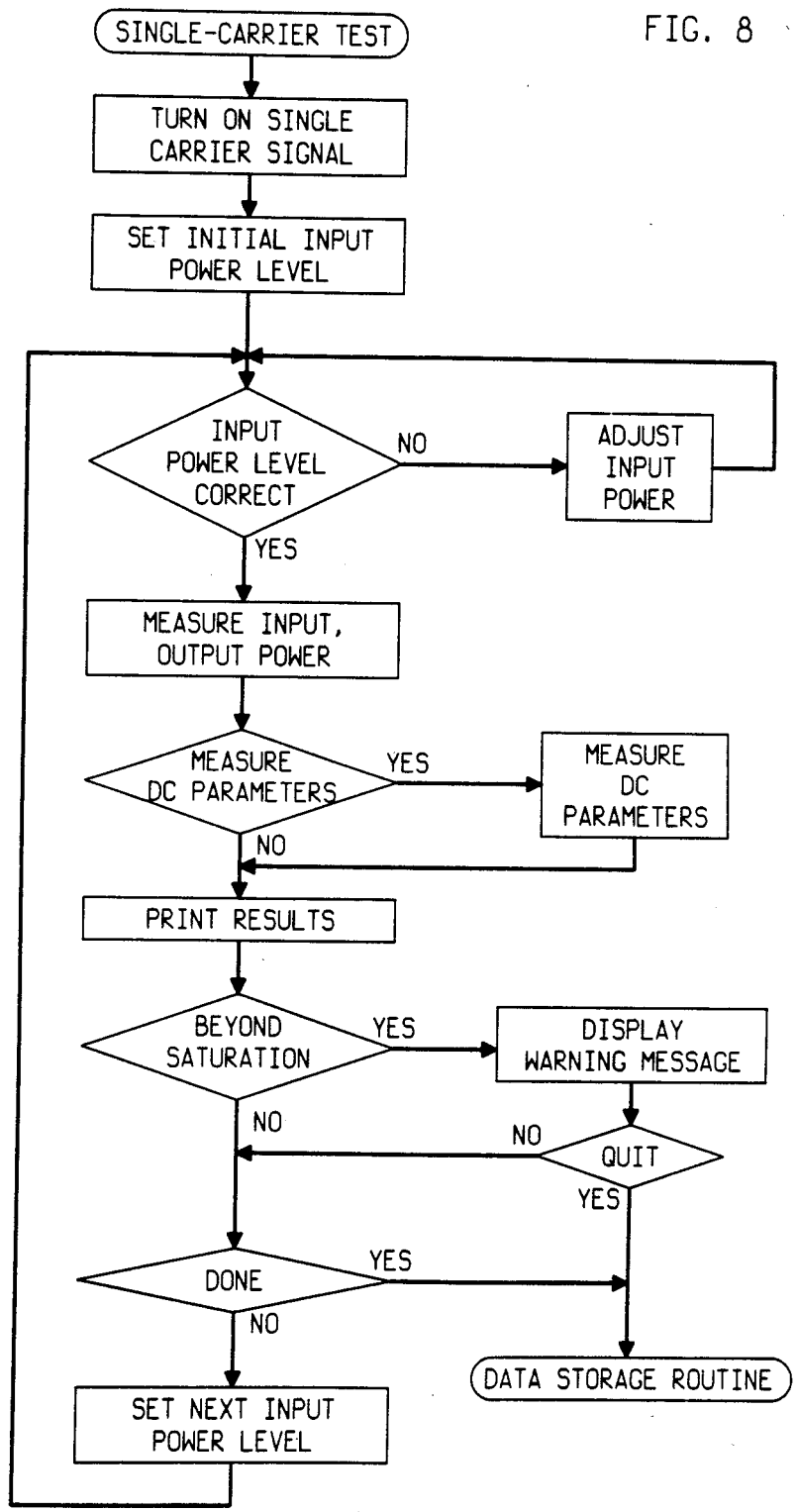
FIG. 8 is a typical flow diagram for implementing the Single-Carrier test portion of the Measure state of FIG. 7.
Figure 9:
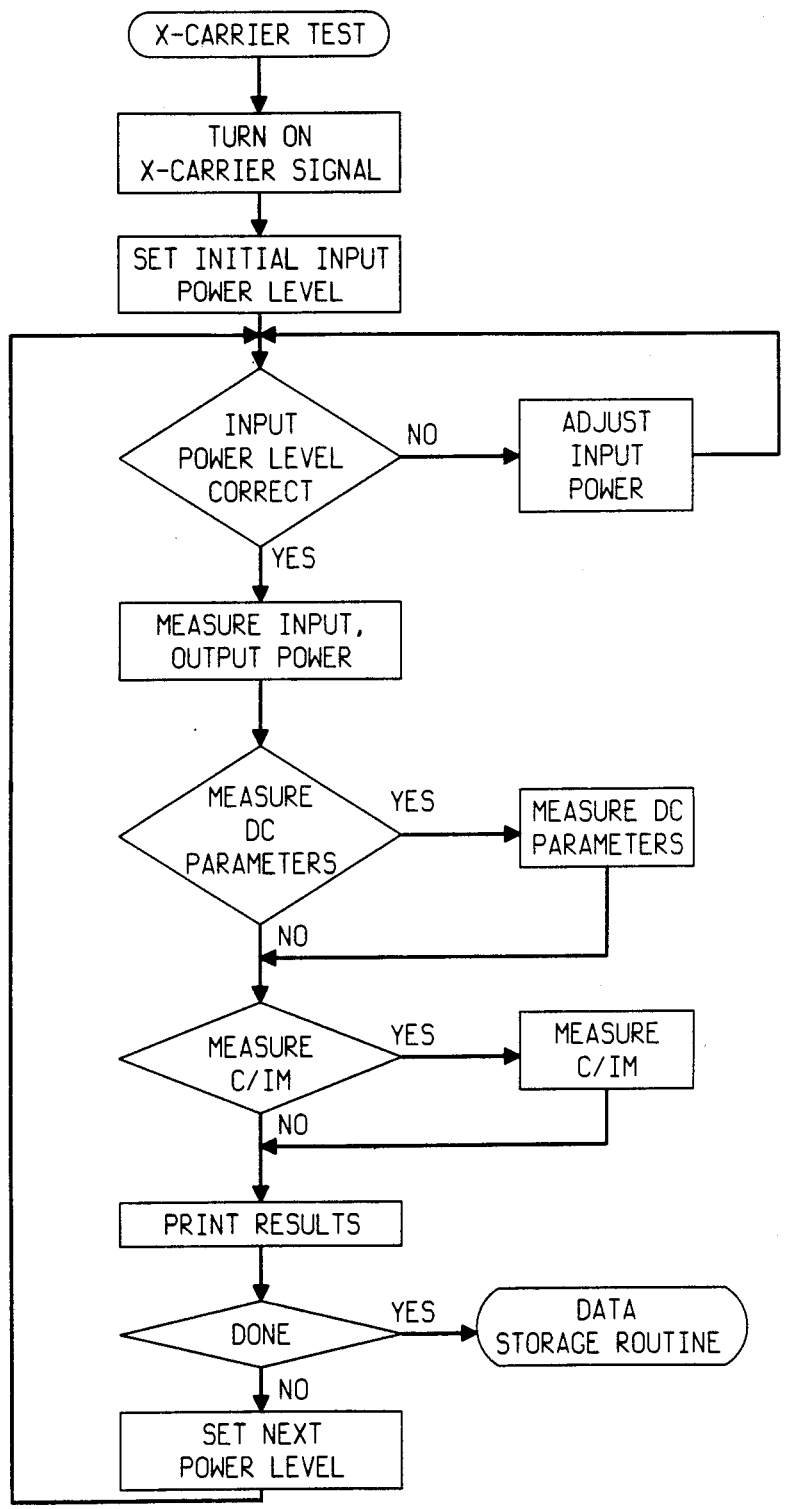
FIG. 9 is a typical flow diagram for implementing the X-Carrier test portion of the Measure state of FIG. 7.
Figure 10:
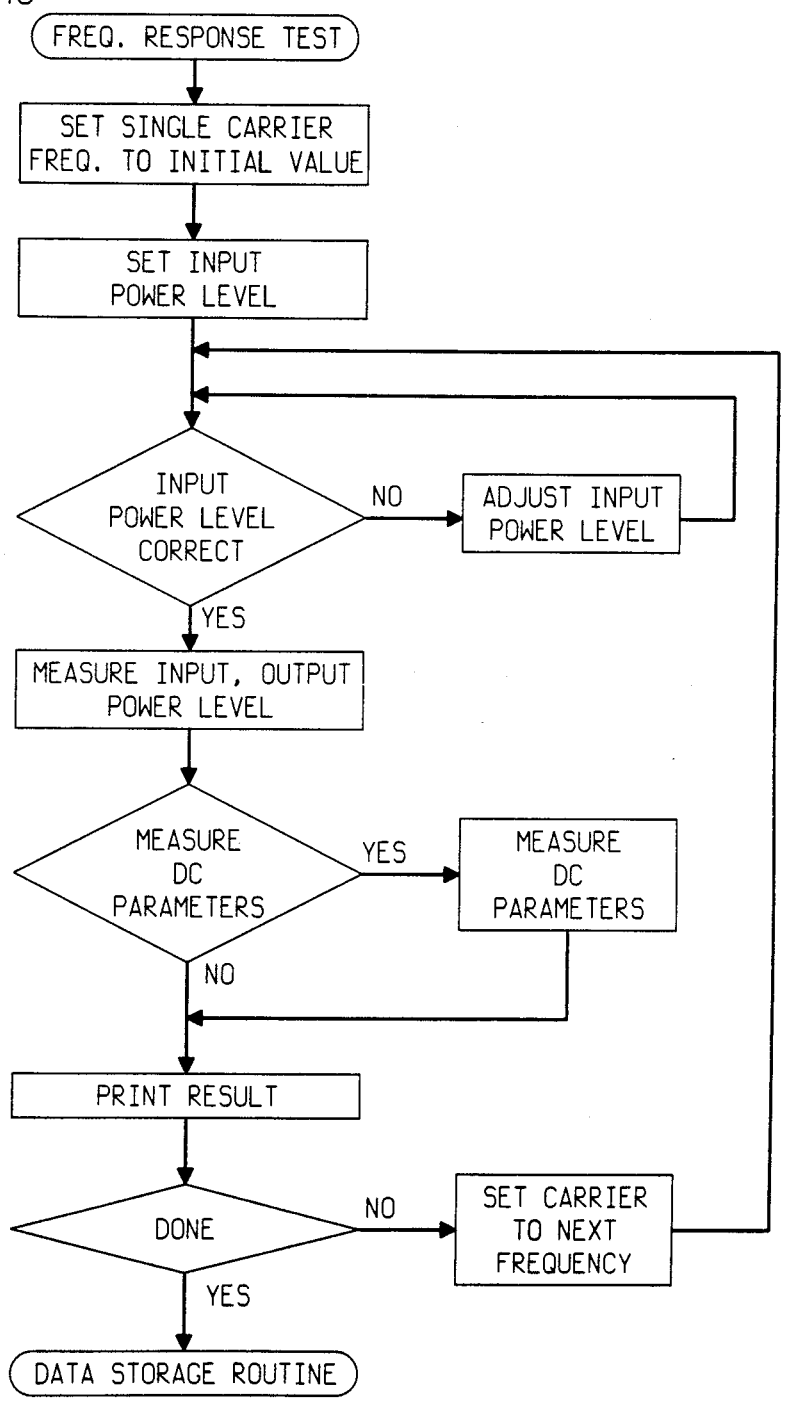
FIG. 10 is a typical flow diagram for implementing the Frequency Response test portion of the Measure state of FIG. 7.
Figure 11:
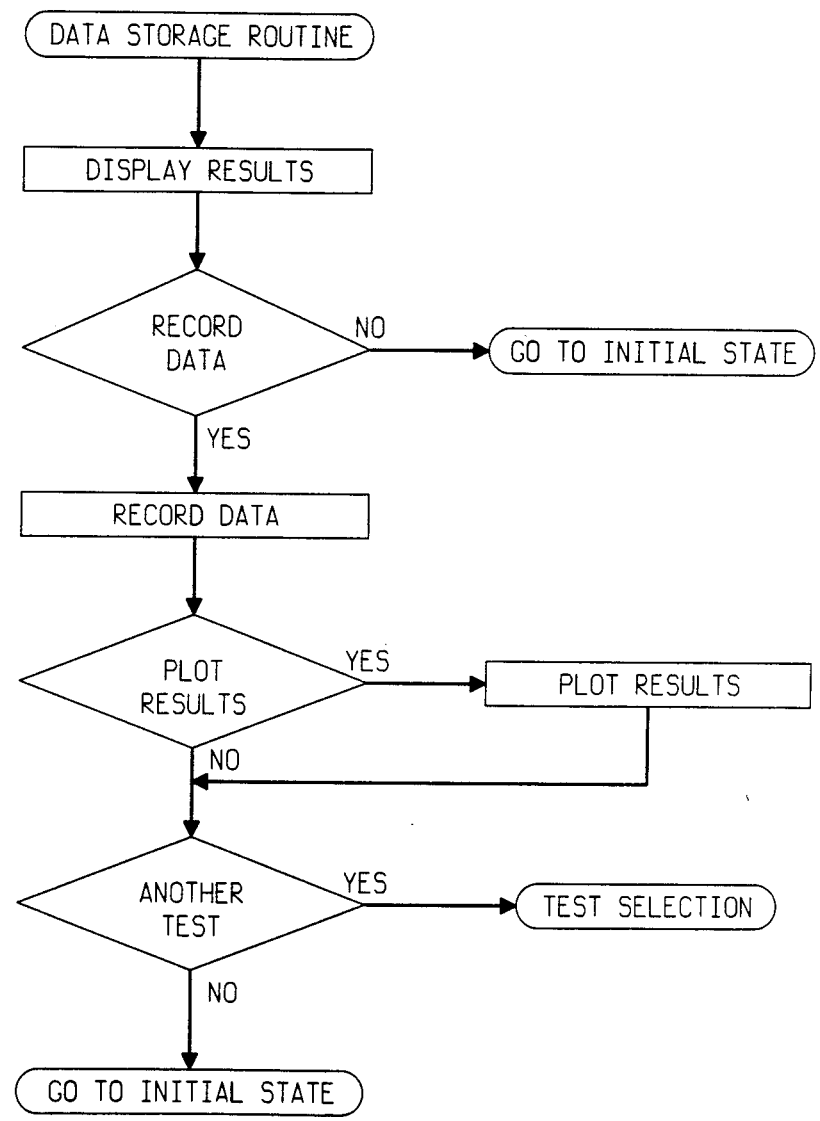
FIG. 11 is a typical flow diagram for implementing the Data Storage Routing portion of the Measure state of FIG. 7.
Figure 12:
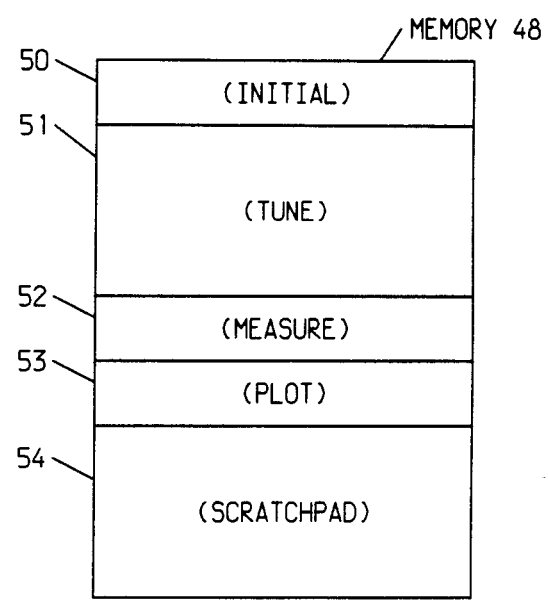
FIG. 12 is an exemplary arrangement of the memory associated with the controller of FIG. 1 for storing the various routines of FIGS. 3–11 and the information used in implementing the measuring system in accordance with the present invention.

In the PLOT STATE the system can be made to generate hard copy plots on the data for detailed analysis or presentation. The selection of plots can typically be controlled by a program constant which may be changed by the user during parameter selection or modification. The system may also be made to normally plot all data which is measured. Exemplary flowcharts for the INITIAL, TUNE and MEASURE STATES in a broad detail are shown in FIGS. 3–5, respectively. It is to be understood that these flowcharts are for exemplary purposes only and not for purposes of limitation. A typical arrangement for memory 48 is shown in FIG. 6. There, in an exemplary manner, the INITIAL STATE programs can be stored in area 50 of memory 48; the TUNE STATE programs stored in area 51 of memory 48; the MEASURE STATE programs stored in area 52 of memory 48; the PLOT STATE programs stored in area 53 of memory 48; and a scratchpad area 54 provided for storing data associated with tests being performed on a device 12.

What is claimed is:

1. A measurement system for characterizing the performance of a device comprising:
   means capable of supplying predetermined test signals and for selectively applying any one of said predetermined test signals at an output terminal of the supplying means at any instant of time;
   means responsive to an output test signal from the supplying and selectively applying means for modulating said output test signal to a predetermined output power level for transmission to an input of the device to be measured;
   means capable of measuring the power level at the input and an output of the device being measured;
   spectrum analyzing means coupled to the output of the device being measured for providing output signals indicative of a predetermined characteristic of the device in response to a test signal being applied to an input of the device being measured;
   means for displaying measured characteristics of a device being measured; and
   control means for generating selective control signals to the supplying and modulating means for controlling the selective application and the output power level, respectively, of the predetermined test signal being supplied to a device being measured and for interpreting the output signals from the power level measuring means and the spectrum analyzing means for providing representative signals to the displaying means.

2. A measurement system in accordance with claim 1 wherein the system further comprises:
   means capable of providing predetermined voltage and current bias signals to a device being measured.

3. A measurement system in accordance with claim 1 wherein the control means includes a memory for storing a sequence of steps for performing a predetermined measurement on the device and for storing data obtained from both the power level measurement means and the spectrum analyzing means, the control means being capable of appropriately interpreting said data and generating representative output signals to the displaying means.

4. A measurement system in accordance with claim 1 wherein the supplying means is capable of supplying either one of a single-carrier and a multiple-carrier signal at the output terminal thereof.

5. A measurement system in accordance with claim 4 wherein the single-carrier is capable of being changed within a predetermined frequency range by the control means.

6. A measurement system in accordance with claim 4 wherein the supplying means comprises a switching means responsive to control signals from the control means for selecting either one of the single-carrier and multiple-carrier signals for transmission to the device to be measured.

7. A measurement system in accordance with claim 5 wherein the supplying means comprises a switching means responsive to control signals from the control means for selecting either one of the single-carrier and multiple-carrier signal for transmission to the device to be measured.

8. A measurement system in accordance with claim 1 wherein the modulation means comprises a PIN modulator coupled to the output terminal of the supplying means and a digital-to-analog conversion means coupled between the modulating means and the control means.

9. A measurement system in accordance with claim 1 wherein the system further comprises:
   a data bus interconnecting the control means with each of the supplying means, the modulating means, the measuring means, the spectrum analyzing means and the displaying means.

* * * * *